United States Patent [19]

Stoetzer et al.

[11] 4,382,981

[45] May 10, 1983

[54] METHOD FOR SHIELDING ELECTRONIC EQUIPMENT BY COATING WITH COPPER CONTAINING COMPOSITION

[75] Inventors: Steven R. Stoetzer, St. Clair Shores; Robert E. Wiley, Port Huron, both of Mich.

[73] Assignee: Acheson Industries, Inc., Port Huron, Mich.

[21] Appl. No.: 308,652

[22] Filed: Oct. 5, 1981

Related U.S. Application Data

[62] Division of Ser. No. 60,771, Jul. 26, 1979, Pat. No. 4,305,847.

[51] Int. Cl.³ .................. B05D 1/02; B05D 5/12; C23C 17/00
[52] U.S. Cl. ..................................... 427/105; 427/123
[58] Field of Search .............................. 427/105, 123

[56] References Cited

U.S. PATENT DOCUMENTS

| | | | |
|---|---|---|---|
| 2,750,303 | 6/1956 | La Berge . | |
| 2,750,307 | 6/1956 | La Berle | 117/123 |
| 2,980,719 | 4/1961 | Haslam | 260/429.5 |
| 3,060,062 | 10/1962 | Katz et al. | 117/212 |
| 3,074,818 | 1/1963 | Lee | 427/123 |
| 3,142,814 | 7/1964 | Robinson | 338/308 |
| 3,382,203 | 5/1968 | Rating et al. | 260/334 |
| 3,501,353 | 3/1970 | Wright | 148/6.14 |
| 3,532,528 | 10/1970 | Bradshaw et al. | 106/290 |
| 3,573,230 | 3/1971 | Van Voorhees . | |
| 3,602,632 | 8/1971 | Ollis . | |
| 3,653,931 | 4/1972 | Borchert et al. | 106/3 |
| 3,716,427 | 2/1973 | Caule | 156/3 |
| 3,790,697 | 2/1974 | Buckingham . | |
| 3,867,738 | 2/1975 | Garner | 16/114 |
| 3,867,738 | 2/1975 | Garner . | |
| 3,867,739 | 2/1975 | Schnuell | 16/190 |
| 3,935,374 | 1/1976 | Yoshikawa et al. . | |
| 3,983,075 | 9/1976 | Marshall et al. . | |
| 3,998,993 | 12/1976 | Chandross et al. | 428/461 |
| 4,070,518 | 1/1978 | Hoffman . | |
| 4,123,562 | 10/1978 | Chandross et al. | 427/58 |
| 4,143,238 | 3/1979 | Sheth . | |
| 4,187,389 | 2/1980 | Foote et al. . | |

FOREIGN PATENT DOCUMENTS 1941328 3/1971 Fed. Rep. of Germany .
2366677 4/1978 France .

OTHER PUBLICATIONS

Product Data Sheet-Acheson; Electrodag 112, 414, 424, 433.

Primary Examiner—James R. Hoffman
Attorney, Agent, or Firm—Harness, Dickey & Pierce

[57] ABSTRACT

A new copper dispersion coating composition particularly useful as a copper shielding coating for plastic enclosures to protect electronic equipment from electromagnetic interference (EMI). The coating maintains high electrical conductivity even after exposure to heat, humidity or salt spray. The coating composition may also be used as a one-coat air dry system that is spray applied and needs no protective overcoat.

9 Claims, No Drawings

METHOD FOR SHIELDING ELECTRONIC EQUIPMENT BY COATING WITH COPPER CONTAINING COMPOSITION

This is a division of application Ser. No. 60,771, filed July 26, 1979, now U.S. Pat. No. 4,305,847.

BACKGROUND OF THE INVENTION

This invention broadly relates to a new coating composition and to a method of applying said coating composition to various enclosures to protect electronic equipment from electromagnetic interference (EMI). More particularly this invention relates to a new copper dispersion coating composition usable as a copper shielding coating that maintains high electrical conductivity even after exposure to heat, humidity and/or salt spray; and thereby, it eliminates many of the shortcomings of other copper coatings that have been attempted for this purpose. The new coating composition of this invention may be applied as a one-coat air dry system that is spray applied and needs no protective overcoat. It also of course may be applied by other means such as brushing, dipping or the like.

The state of the art is indicated by the following: U.S. Pat. Nos. 2,750,303; 2,980,719; 3,074,818; 3,142,814; 3,382,203; 3,998,993; 4,123,562; 2,750,307; 3,501,353; 3,532,528; 3,653,931; 3,867,738; 3,867,739; 3,716,427; 3,060,062; German Pat. No. 1,941,328; and Acheson Colloids Co. product data sheets on Electrodag 112, 414, 424, and 433.

It has been known that copper particles dispersed in a binder resin material or solution could be used to make an electrically conductive coating. However all of the prior coatings of this type have had the major deficiency that during storage or during usage, the copper oxidizes and the electrical properties changed such that there was a detrimental effect. Under many usage conditions this electrical property change is of such magnitude that the formerly conductive coating becomes an insulating coating. Attempts to overcome this change of electrical properties have called for replacement of the copper conductive particles with the more expensive noble-metals such as silver, gold and the platinum group, all of which greatly and significantly increase the cost of the electrically conductive coating. Thus a copper dispersion coating has long been sought after, which when applied in film form to a substrate, would provide good electrical conductance properties even after exposure to elevated temperatures for substantial time periods.

Another proposed solution which has been investigated in the past is the treatment of the copper particle to prevent its oxidation and subsequent change in electrical properties. Some of the solutions that have been suggested are treatment of the copper with chemicals such as nitrosobenzene, benzotriazole, chromium salts, silicates, and the like. Other treatments suggested have included high molecular weight alcohols and stearates. These attempted solutions have been ineffective or temporary at best. In addition many of these surface treatments resulted in the copper particle becoming an electrical insulator rather than the desired electrical conductor.

Accordingly a main object of this invention is to provide a new coating composition containing finely particulated copper particles and which composition is suitable for use in forming applied coatings having very good electrical conductance properties.

Another important object of this invention is to provide a novel method of forming EMI shielding coatings on enclosures for electronic equipment.

Another object of the invention is to provide a new copper coating composition which when applied as a coating maintains high electrical conductivity even after exposure to heat, humidity or salt spray.

Another object of the invention is to provide an environmentally stable air dry copper coating.

Another object of the invention is to provide a new copper coating composition which provides controlled electrical properties.

Another object of the invention is to provide a novel method of protecting electronic equipment from electromagnetic interference (EMI) by applying a copper shielding coating to enclosures for the equipment.

Other objects, features and advantages of the present invention will become apparent from the subsequent description and the appended claims.

SUMMARY OF THE INVENTION

A significant purpose of this invention is to describe a method of making an electrically conductive coating composition containing copper particles which coating composition has a long storage life and yet the coating still retains highly useful electrical conductance properties after exposure to elevated temperatures for significant periods of time. By elevated temperatures it is meant temperatures in the range of 160° F., and/or temperatures up to as high as approximately 200° F. or higher in some instances. The uses for these new compositions include electromagnetic interference shielding; production of printed circuits by silk screening, and similar uses where a highly conductive film coating is needed.

Numerous prior art deficiencies have been overcome through the discovery that if finely divided copper particles are co-mixed with special organic titanates as described herein, the copper particles do not appear to degrade and the conductivity of the deposited film remains stable over a long period of time even at the elevated temperatures encountered in many specialized uses. Although the discovery of this invention has been used primarily to preserve the desirable electrical properties of the copper in such applied coatings or films, it has also been discovered that an improved decorating effect is also obtained by means of the non-oxidizing copper coatings which are disclosed herein.

DESCRIPTION OF PREFERRED EMBODIMENTS

While it is not fully understood as to why the invention operates to provide such significantly useful electrically conductive copper coatings, particularly in the area of EMI shielding coatings, the following preferred embodiments and preferred aspects of the invention will now be described.

The new compositions discovered and disclosed herein have the desirable features of ease in manufacturing, long shelf life, ease of application, and most importantly, have acceptable electrical properties even when used at elevated temperatures.

The pigment material used in the coating composition is substantially of copper. For example the pigment material is substantially pure electrical grade copper and/or it may be such as an electrical grade copper alloy. Normally the copper particles used herein are of 95% purity or greater and preferably they are of 99% purity or greater.

The pigment particle size broadly stated should be under 200 microns in average particle size and preferably it is under 50 microns average particle size.

The binder resin used in the coating composition can be any one of a number of different materials. The binder resin is preferably a thermoplastic resin material which is compatible with the copper particles and with the titanate material used in the coating composition. Thermosetting resin materials may also be used as the binder resin herein. The binder resin is selected from at least one of the group consisting of thermoplastic acrylic, vinyl, urethane, alkyd, polyester, hydrocarbon, fluoroelastomer and celluosic resins; and, thermosetting acrylic, polyester, epoxy, urethane, and alkyd resins. The binder resin material chosen should generally be one which is easily used for spray coating applications, and also it should be non-reactive with the copper and non-reactive with the titanate.

The pigment to binder ratio by weight in the coating composition of the invention should broadly be within the range between about 20 to 1 and about 2 to 1, and preferably it should be maintained in the range between about 10 to 1 and about 4 to 1.

The organic titanate material used in the coating composition is one which provides good heat stability to the coating as applied on a substrate, and it enables the coating to maintain good electrical conductivity during sustained exposure to elevated temperatures. The organic titanate used in the composition should be present within the broad range of about ½% to about 18% by weight of the pigment material in the composition. Preferably it should be within the range of about 2% to about 12% by weight of the pigment material, and best results are obtained within the range of about 3% to about 10%. The organic titanate should preferably be a pyrophospate type, with best results being obtained with an organic titanate which is of the pyrophosphate type selected from at least one of the group consisting of monoalkoxy titanates of titanium chelates. As described herein the organic titanate material enables the coating as applied to maintain an electrical conductivity of under 10 ohms per square at one mil applied film thickness after exposure to an elevated temperature of about 160° F. for substantial time periods. Preferred results can be obtained, using the coatings as described herein, of under 5 ohms per square. For some applications, conductivity values up to 150 ohms per square are satisfactory, but for most electrical uses, resistance values below about 10 ohms per square are desirable.

Particularly useful organic titanates for use in the coating composition of this invention are the following:

(1) isopropyl tri(dioctylpyrophosphato) titanate
(2) titanium di(dioctylpyrophosphate) oxyacetate
(3) tri(butyl, octyl pyrophosphato) isopropyl titanate mono(dioctyl, hydrogen phosphite)
(4) titanium di(butyl, octyl pyrophosphate) di (dioctyl, hydrogen phosphite) oxyacetate
(5) di(butyl, methyl pyrophosphato), isopropyl titanate mono(dioctyl, hydrogen) phosphite
(6) di(butyl, methyl pyrophosphato) ethylene titanate mono(dioctyl, hydrogen phosphate)

The organic solvent carrier used with the coatings are conventional organic solvents or solvent blends useful for dissolving or dispersing the binder resin. Because of the known tendency of the organic titanates to react with water, the solvent carrier should be of very low water content or substantially water free. Also because one use of the coating composition is to obtain an electromagnetic interference shield on the interior surfaces of plastic enclosed electronic devices, the solvent blend used should be one which is not only compatible with the resin and copper particles but also with the plastic containers and one which will not degrade the plastic materials. For example with many solvent sensitive plastics a blend of isopropanol and toluol has been found desirable. For ease of application, it is generally desirable to use the coating composition at a low total solids level. Many of the conventional solvents such as ketones, alcohols, acetates, etc. can be used as diluents. Generally suitable solvents are the ketones, aromatics, alcohols, aliphatics or blends of same.

Other materials which may also optionally be present in the coating composition are for example various thixotropic agents selected from at least one of the group consisting of finely divided silicas or hydrated silicates. The thixotropic agent when used may be present in the amount of about 0.1% up to about 7% by weight of the total solids and preferably within the range of about 0.1% to about 5% by weight. Particular materials for this purpose are the Bentone clays and fumed collidal silicas such as Cab-O-Sil.

The percent total solids in the coating composition should broadly be within the range of about 20% up to about 85% by weight, and preferably within the range of about 40% to about 80% by weight.

In the following examples the formulating process was maintained essentially the same for comparative purposes. In addition to the small size shot mills, larger equipment such as ball mills, pebble mills, attritors (continuous or batch processing types), high shear mixers and the like can be used.

In order to further illustrate the invention the following examples are provided. It is to be understood however that the examples are included for illustrative purposes and are not intended to be limiting of the scope of the invention as set forth in the subjoined claims.

EXAMPLE NO. 1*

| | |
|---|---|
| Thermoplastic Methyl/Butyl Methacrylate Copolymer Resin (Acryloid B-66) | 10.0 |
| Titanium Di(Dioctylpyrophosphate) Oxyacetate KR-138S Organic Titanate | 5.4 |
| Toluol | 30.0 |
| Copper powder RL500 (Copper Pigment) | 60.0 |
| Denatured Ethyl Alcohol (Jaysol) | 10.0 |

Formulating Procedure:
(1) Predisperse titanate and resin in solvents.
(2) Load all ingredients in 8 oz. shot mill and mix for 15 minutes.

Results for 1 mil thick applied coating:
Initial Resistance—0.412 ohms per square at 1 mil.
One hour at 160° F.—0.520 ohms per square at 1 mil.
24 hours at 160° F.—0.700 ohms per square at 1 mil.
Test coatings made by spraying on clean glass substrate and air drying 24 hours for initial reading and afterdrying for stated intervals.

*All examples are air-dry type coatings, except Nos. 11 17 and 18. All amounts shown are in parts by weight.

EXAMPLE NO. 2

| | |
|---|---|
| Ethyl Methacrylate Resin | |
| Acryloid B-72 | 10.0 |
| Copper Powder | |
| MD 750 Copper Pigment | 40.0 |
| Toluol | 20.0 |
| Methyl Ethyl Ketone | 20.0 |
| Di(Butyl, Methyl Pyrophosphato), Isopropyl Titanate Mono(Dioctyl, Hydrogen) Phosphite | |
| KR 62ES (Ken-Rich) | 5.0 |
| Fumed Colloidal Silica | |
| (Cabosil M-5) | 0.5 |

Formulating Procedure same as Example 1.
Results for 1 mil thick applied coating:
Initial Resistance—9.93 ohms per square at 1 mil.
One hour at 160° F.—13.4 ohms per square at 1 mil.
24 hours at 160° F.—34.5 ohms per square at 1 mil.

EXAMPLE NO. 3

| | |
|---|---|
| Methyl Methacrylate Resin | |
| Acryloid A-11 | 7.0 |
| Copper Particles | |
| RL500 | 70.0 |
| Methyl Ethyl Ketone | 20.0 |
| Methyl Isobutyl Ketone | 20.0 |
| Isopropyl Tri(Dioctylpyrophosphato) Titanate | |
| KR38S Organic Titanate (Ken-Rich) | 1.4 |
| Bentonite Clay | |
| Bentone 27 | 2.0 |

Formulating Procedure same as Example 1.
Results for 1 mil thick applied coating:
Initial Resistance—0.616 ohms per square at 1 mil.
One hour at 160° F.—0.616 ohms per square at 1 mil.
24 hours at 160° F.—0.716 ohms per square at 1 mil.

EXAMPLE NO. 4

| | |
|---|---|
| Thermoplastic Vinyl Resin | |
| Union Carbide Corp. - VAGH | 10.0 |
| Copper Particles | |
| RL500 | 120.0 |
| Butyl Acetate | 60.0 |
| Di(Butyl, Methyl Pyrophosphato), Isopropyl Titanate Mono(Dioctyl, Hydrogen) Phosphite | 8.0 |

Formulating Procedure same as Example 1.
Results for 1 mil thick applied coating:
Initial Resistance—2.92 ohms per square at 1 mil.
One hour at 160° F.—2.82 ohms per square at 1 mil.
24 hours at 160° F.—4.00 ohms per square at 1 mil.

EXAMPLE NO. 5

| | |
|---|---|
| Thermoplastic Vinyl Resin | |
| Union Carbide Corp. - VYND | 5.0 |
| Copper Particles | |
| RL500 | 50.0 |
| Methyl Ethyl Ketone | 40.0 |
| Titanium Di(Butyl, Octyl Pyrophosphato) Di(Dioctyl, Hydrogen Phosphite) Oxyacetate | |
| KR158FS | 5.0 |

Formulating Procedure same as Example 1.
Results for 1 mil thick applied coating:
Initial Resistance—10.24 ohms per square at 1 mil.
One hour at 160° F.—11.56 ohms per square at 1 mil.
24 hours at 160° F.—14.88 ohms per square at 1 mil.

EXAMPLE NO. 6

| | |
|---|---|
| Rosin-Ester Coating Resin | |
| Cellolyn 102 | 5.4 |
| Ethyl Cellulose | 5.4 |
| Butanol | 3.2 |
| Xylol | 2.2 |
| Methyl Ethyl Ketone | 16.7 |
| Butyl Acetate | 11.0 |
| Copper Powder | |
| RL500 | 50.0 |
| Di(Butyl, Methyl Pyrophosphato), Isopropyl Titanate Mono(Dioctyl, Hydrogen) Phosphite | |
| KR62ES | 9.0 |
| Fumed Colloidal Silica | |
| Cab-O-Sil M-5 | 1.0 |

Formulating Procedure same as Example 1.
Results for 1 mil thick applied coating:
Initial Resistance—0.563 ohms per square at 1 mil.
One hour at 160° F.—0.605 ohms per square at 1 mil.
24 hours at 160° F.—0.735 ohms per square at 1 mil.

EXAMPLE NO. 7

| | |
|---|---|
| Methyl Methacrylate Resin | |
| Acryloid A-11 | 5.0 |
| Toluol | 30.0 |
| Di(Butyl, Methyl Pyrophosphato), Isopropyl Titanate Mono(Dioctyl, Hydrogen) Phosphite | |
| KR62ES | 8.0 |
| Bentonite Clay | |
| Bentone 34 | 1.5 |
| Copper Powder | |
| RL500 | 60.0 |

Formulating Procedure same as Example 1.
Results for 1 mil thick applied coating:
Initial Resistance—0.184 ohms per square at 1 mil.
One hour at 160° F.—0.196 ohms per square at 1 mil.
24 hours at 160° F.—0.208 ohms per square at 1 mil.

EXAMPLE NO. 8

| | |
|---|---|
| Ethyl Cellulose | 8.0 |
| Xylol | 49.0 |
| Butanol | 3.0 |
| Denatured Ethyl Alcohol | 10.0 |
| Tri(Butyl, Octyl Pyrophosphato) Isopropyl Titanate Mono(Dioctyl, Hydrogen Phosphite) | |
| KR58FS | 6.0 |
| Copper Powder | |
| RL500 | 40.0 |

Formulating Procedure same as Example 1.
Results for 1 mil thick applied coating:
Initial Resistance—0.584 ohms per square at 1 mil.
One hour at 160° F.—0.604 ohms per square at 1 mil.
24 hours at 160° F.—0.660 ohms per square at 1 mil.

EXAMPLE NO. 9

| | |
|---|---|
| Nitrocellulose | 4.2 |
| Toluol | 3.2 |
| Ethanol | 12.0 |
| Copper Powder | |
| RL500 | 36.0 |
| Titanium Di(Butyl, Octyl Pyrophosphate) Di(Dioctyl, Hydrogen) Phosphite) Oxyacetate | |
| KR158FS | 1.8 |

Formulating Procedure same as Example 1.

Results for 1 mil thick applied coating:
Initial Resistance—3.2 ohms per square at 1 mil.
One hour at 160° F.—3.2 ohms per square at 1 mil.
24 hours at 160° F.—3.2 ohms per square at 1 mil.

EXAMPLE NO. 10

| | |
|---|---|
| Methyl Methacrylate Resin | |
| Elvacite 2008 | 10.0 |
| Cellulose Acetate Butyrate | |
| CAB 381-20 | 0.5 |
| Copper Powder | |
| RL500 | 50.0 |
| Toluol | 20.0 |
| Methyl Ethyl Ketone | 24.5 |
| Titanium Di(Butyl, Octyl Pyrophosphate) Di(Dioctyl, Hydrogen Phosphite) Oxyacetate | |
| KR158FS | 8.0 |

Formulating Procedure same as Example 1.
Results for 1 mil thick applied coatings:
Initial Resistance—1.63 ohms per square at 1 mil.
One hour at 160° F.—1.71 ohms per square at 1 mil.
24 hours at 160° F.—1.93 ohms per square at 1 mil.

EXAMPLE NO. 11

| | |
|---|---|
| Thermoset Acrylic Resin | |
| Acryloid AT-50 | 20.0 |
| Toluol | 10.0 |
| Copper Powder | |
| RL500 | 69.0 |
| Isopropyl Tri(Dioctylpyrophosphato) Titanate | |
| KR-38S | 6.0 |

Formulating Procedure same as Example 1.
Cured 20 min. at 300° F.
Results for 1 mil thick applied coating:
Initial Resistance—0.124 ohms per square at 1 mil.
One hour at 160° F.—0.128 ohms per square at 1 mil.
24 hours at 160° F.—0.128 ohms per square at 1 mil.

EXAMPLE NO. 12

| | |
|---|---|
| Cellulose Acetate Butyrate | |
| CAB 381-20 | 5.0 |
| Copper Powder | |
| RL500 | 40.0 |
| Methyl Ethyl Ketone | 49.0 |
| Di(Butyl, Methyl Pyrophosphato), Isopropyl Titanate Mono(Dioctyl, Hydrogen) Phosphite | |
| KR62ES | 3.0 |

Formulating Procedure same as Example 1.
Results for 1 mil thick applied coatings:
Initial Resistance—0.728 ohms per square at 1 mil.
One hour at 160° F.—0.796 ohms per square at 1 mil.
24 hours at 160° F.—0.928 ohms per square at 1 mil.

EXAMPLE NO. 13

| | |
|---|---|
| Methyl Methacrylate Resin | |
| Acryloid B-82 | 5.0 |
| Copper Powder | |
| RL500 | 90.0 |
| Di(Butyl, Methyl Pyrophosphato), Isopropyl Titanate Mono(Dioctyl, Hydrogen) Phosphite | |
| KR62ES | 7.0 |
| Toluol | 40.0 |
| Isopropanol | 10.0 |
| Colloidal Fumed Silica | |
| Cabosil M-5 | 1.5 |

| | |
|---|---|
| -continued | |
| Butanol | 5.0 |

Formulating Procedure same as Example 1.
Results for 1 mil thick applied coating:
Initial Resistance—1.28 ohms per square at 1 mil.
One hour at 160° F.—1.38 ohms per square at 1 mil.
24 hours at 160° F.—2.15 ohms per square at 1 mil.

EXAMPLE NO. 14

| | |
|---|---|
| Polyester Desmophen 1300 | 10.0 |
| Copper Powder | |
| RL500 | 50.0 |
| Tri(Butyl, Octyl Pyrophosphato) Isopropyl Titanate Mono(Dioctyl, Hydrogen) Phosphite | |
| KR58FS | 6.5 |
| Methyl Ethyl Ketone | 10.0 |
| Butyl Acetate | 20.0 |
| Polyisocyanate | |
| Mondur CB-75 | 18.0 |

Formulating Procedure:
(1) Disperse KR58FS in solvents and load with RL500 and Des. 1300 in 8 oz. shot mill for 15 minutes.
(2) Add Mondur CB-75 and mix thoroughly.
Results for 1 mil thick applied coating:
Initial Resistance—24.9 ohms per square at 1 mil.
One hour at 160° F.—24.5 ohms per square at 1 mil.
24 hours at 160° F.—29.4 ohms per square at 1 mil.

EXAMPLE NO. 15

| | |
|---|---|
| Vinyl Resin | |
| Union Carbide Corp. VAGH | 8.0 |
| Copper Powder | |
| RL500 | 60.0 |
| Methyl Isobutyl Ketone | 40.0 |
| Titanium Di(Octylpyrophosphate) Oxyacetate | |
| KR138S | 8.0 |

Formulating Procedure same as Example 1.
Results for 1 mil thick applied coating:
Initial Resistance—0.616 ohms per square at 1 mil.
One hour at 160° F.—0.736 ohms per square at 1 mil.
24 hours at 160° F.—0.952 ohms per square at 1 mil.

EXAMPLE NO. 16

| | |
|---|---|
| Polyester Coating Resin | |
| INOLEX 5171-200 | 10.0 |
| Copper Powder | |
| RL500 | 80.0 |
| Toluol | 30.0 |
| Di(Butyl, Methyl Pyrophosphato), Isopropyl Titanate Mono(Dioctyl, Hydrogen) Phosphite | |
| KR62ES | 9.0 |
| Polyisocyanate | |
| Desmodur N-75 | 9.0 |

Formulating Procedure:
(1) Predisperse titanate in solvents.
(2) Load blend with RL500 and polyester for 15 minutes in 8 oz. shot mill.
(3) Combine with polyisocyanate.
Results for 1 mil thick applied coating:
Initial Resistance—2.4 ohms per square at 1 mil.
One hour at 160° F.—2.54 ohms per square at 1 mil.
24 hours at 160° F.—3.02 ohms per square at 1 mil.

EXAMPLE NO. 17

| | |
|---|---|
| Thermosetting Epoxy Resin | |
| Epon 1001 | 7.0 |
| Urea Resin | |
| Uformite F-492 | 3.0 |
| Toluol | 20.0 |
| Methyl Ethyl Ketone | 20.0 |
| Copper Powder | |
| RL500 | 70.0 |
| Di(Butyl, Methyl Pyrophosphato) Ethylene Titanate Mono(Dioctyl, Hydrogen Phosphate) | |
| KR262ES | 5.0 |
| Bentonite | |
| Bentone 27 | 1.0 |

Formulating Procedure same as Example 1.
Cured 15' at 300° F.
Results for 1 mil thick applied coating:
Initial Resistance—8.4 ohms per square at 1 mil.
One hour at 160° F.—8.4 ohms per square at 1 mil.
24 hours at 160° F.—11.2 ohms per square at 1 mil.

EXAMPLE NO. 18

| | |
|---|---|
| Thermosetting Polyester Resin | |
| Cyplex 1600 | 18.0 |
| Urea Curative Resin | |
| Beetle 80 | 3.0 |
| para-toluenesulfonic acid | |
| PTSA | 0.2 |
| Copper Powder | |
| RL500 | 140.0 |
| Di(Butyl, Methyl Pyrophosphato) Ethylene Titanate Mono(Dioctyl, Hydrogen Phosphate) | |
| KR262ES | 9.0 |
| Toluol | 10.0 |
| Butyl Acetate | 10.0 |
| Ethylene Clycol Monoethyl Ether | |
| Cellosolve | 10.0 |

Formulating Procedure same as Example 1.
Cured 60' at 300° F.
Results for 1 mil thick applied coating:
Initial Resistance—137.6 ohms per square at 1 mil.
One hour at 160° F.—136.0 ohms per square at 1 mil.
24 hours at 160° F.—136.0 ohms per square at 1 mil.

EXAMPLE NO. 19

| | |
|---|---|
| Methyl/Butyl Methacrylate Copolymer | |
| Acryloid B-66 | 13.6 |
| Copper Powder | |
| RL500 Copper Pigment | 54.3 |
| Toluol | 18.3 |
| Ethanol | |
| Jaysol | 9.2 |
| Titanium Di(Dioctylpyrophosphate) Oxyacetate | |
| KR 138S | 4.5 |

Formulating Procedure same as Example 1.
Results for 1 mil thick applied coating:
Initial Resistance—0.417 ohms per square at 1 mil.
One hour at 160° F.—0.447 ohms per square at 1 mil.
24 hours at 160° F.—0.498 ohms per square at 1 mil.

EXAMPLE NO. 20

| | |
|---|---|
| Methyl/Butyl Methacrylate Copolymer | |
| Acryloid B-66 | 13.6 |
| Copper Powder | |
| RL500 Pigment | 55.0 |
| Toluol | 18.3 |
| Ethanol | |
| Jaysol | 5.0 |
| Ethylene Glycol Monoethyl Ether | |
| Cellosolve | 4.3 |
| Bentonite | |
| Bentone 34 | 1.5 |
| Tri(Butyl, Octyl Pyrophosphato) Isopropyl Titanate Mono(Dioctyl, Hydrogen Phosphite) | |
| KR-58FS | 2.3 |

Formulating Procedure same as Example 1.
Results for 1 mil thick applied coating:
Initial Resistance—0.129 ohms per square at 1 mil.
One hour at 160° F.—0.144 ohms per square at 1 mil.
24 hours at 160° F.—0.159 ohms per square at 1 mil.

EXAMPLE NO. 21

| | |
|---|---|
| Thermoplastic Fluoroelastomer Resin | |
| Viton | 10.0 |
| Butyl Acetate | 50.0 |
| Titanium Di(Butyl, Octyl Pyrophosphate) Di(Dioctyl, Hydrogen Phosphite) Oxyacetate | |
| KR158FS | 5.0 |
| Copper Powder | |
| RL500 Copper Pigment | 80.0 |
| Methyl Ethyl Ketone | 20.0 |

Formulating Procedure same as Example 1.
Results for 1 mil thick applied coatings:
Initial Resistance—13.6 ohms per square at 1 mil.
One hour at 160° F.—18.4 ohms per square at 1 mil.
24 hours at 160° F.—26.4 ohms per square at 1 mil.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. A method for shielding an electronic device having an enclosure associated therewith, said method being comprised of protecting said device from electromagnetic interference (EMI) by applying to said enclosure a coating composition comprised of, a pigment material substantially of copper said pigment being finely particulated and having a particle size of less than about 200 microns, a binder resin, the pigment to binder weight ratio in said composition being between about 20 to 1 and about 2 to 1, an organic titanate material of the pyrophosphate type for providing good heat stability to the coating as applied to the enclosure, said organic titanate being present in amount of about ½% to about 18% by weight of said pigment material, and, an organic solvent carrier for the composition, said composition containing a weight percent total solids within a range of about 20% to about 85%.

2. The method of claim 1 further characterized in that, said organic titanate is a pyrophosphate type selected from at least one of the group consisting of monoalkoxy titanates or titanium chelates.

3. The method of claim 1 further characterized in that, said pigment to binder ratio is between about 10 to 1 and about 4 to 1, said organic titanate is present between about 2% and about 12% by weight of said pigment material, said percent total solids is between about 40% and about 80%.

4. The method of claim 1 further characterized in that, said pigment has a particle size of less than about 50 microns.

5. The method of claim 1 further characterized in that, said composition additionally contains a thixotropic agent selected from at least one of the group consisting of finely divided silicas, or hydrated silicates, said thixotropic agent being present between about 0.1% and 7% by weight of the total solids.

6. The method of claim 1 further characterized in that, said binder resin of is a thermoplastic resin.

7. The method of claim 1 further characterized in that, said binder resin is a thermoplastic acrylic resin.

8. The method of claim 1 further characterized in that, said organic titanate material means enables the coating as applied to maintain an electrical conductivity of under 10 ohms per square at 1 mil applied film thickness after exposure to an elevated temperature of about 160° F. for substantial time periods.

9. The method of claim 1 further characterized in that, said organic titanate material enables the coating as applied to maintain an electrical conductivity of under 150 ohms per square at 1 mil applied film thickness after exposure to an elevated temperature of about 160° F. for substantial time periods.

* * * * *